US012628453B2

(12) United States Patent
Yang et al.

(10) Patent No.: US 12,628,453 B2
(45) Date of Patent: May 12, 2026

(54) QUAD PHOTODIODE MICROLENS ARRANGEMENTS, AND ASSOCIATED SYSTEMS AND METHODS

(71) Applicant: OMNIVISION TECHNOLOGIES, INC., Santa Clara, CA (US)

(72) Inventors: Xiaodong Yang, San Jose, CA (US); Sylvia Shuoyu Zhang, Gilroy, CA (US); John Li, San Jose, CA (US); Chengming Liu, Fremont, CA (US); Guansong Liu, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 454 days.

(21) Appl. No.: 17/832,395

(22) Filed: Jun. 3, 2022

(65) Prior Publication Data

US 2023/0395627 A1 Dec. 7, 2023

(51) Int. Cl.
H10F 39/00 (2025.01)
H10F 39/18 (2025.01)

(52) U.S. Cl.
CPC ....... H10F 39/8063 (2025.01); H10F 39/182 (2025.01); H10F 39/8053 (2025.01); *H10F 39/8023* (2025.01)

(58) Field of Classification Search
CPC ......... H01L 27/14627; H01L 27/14645; H01L 27/1463; H01L 27/14621; H01L 27/14643; H10F 39/8063; H10F 39/182; H10F 39/8023; H10F 39/8053; H10F 39/806
See application file for complete search history.

(56) References Cited

U.S. PATENT DOCUMENTS

| | | | | |
|---|---|---|---|---|
| 10,694,169 B1 * | 6/2020 | Topliss | ...................... | G06T 7/70 |
| 2015/0350583 A1 * | 12/2015 | Mauritzson | .......... | H04N 25/134 |
| | | | | 257/432 |
| 2017/0170222 A1 * | 6/2017 | Toda | ...................... | H04N 25/76 |
| 2017/0366770 A1 * | 12/2017 | Yokogawa | .......... | H10F 39/8057 |
| 2018/0006078 A1 * | 1/2018 | Fereyre | ............. | H01L 27/14643 |
| 2020/0273894 A1 * | 8/2020 | Inui | ...................... | H01L 27/1464 |
| 2022/0293653 A1 * | 9/2022 | Moon | ............... | H01L 27/14627 |

FOREIGN PATENT DOCUMENTS

TW 201839489 A 11/2018

OTHER PUBLICATIONS

Office Action received Dec. 2, 2025, issued in corresponding Taiwan Application No. 112114673, filed Apr. 20, 1 2023, 28 pages.

* cited by examiner

*Primary Examiner* — Georgia Y Epps
*Assistant Examiner* — Erin R Garber
(74) *Attorney, Agent, or Firm* — CHRISTENSEN O'CONNOR JOHNSON KINDNESS PLLC

(57) ABSTRACT

Quad photodiode microlens arrangements, and associated systems and methods. In one embodiment, a plurality of pixels are arranged in rows and columns of a pixel array disposed in a semiconductor material. The plurality of pixels includes green (G) pixels, red (R) pixels, blue (B) pixels and clear (C) pixels. Each pixel comprises a plurality of photodiodes that are configured to receive incoming light through an illuminated surface of the semiconductor material. A plurality of small microlenses are distributed over individual photodiodes of clear (C) pixels. A plurality of large microlenses are distributed over individual green (G) pixels. A diameter of the small microlenses is smaller than a diameter of the large microlenses.

16 Claims, 5 Drawing Sheets

QUAD PHOTODIODE MICROLENS ARRANGEMENTS, AND ASSOCIATED SYSTEMS AND METHODS

BACKGROUND INFORMATION

Field of the Disclosure

This disclosure relates generally to the design of image sensors, and in particular, relates to image sensors that use different arrangements of microlenses to improve balance between autofocusing and resolution of the image sensor.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

In some applications, auto focusing of the image sensor depends on dedicated groups of pixels that engage in phase detection auto focus (PDAF). It is known that autofocusing improves with the size of lens that covers photodiodes of the pixels. On the other hand, large size of lens tends to degrade the resolution of the pixels. Therefore, systems and methods that can provide both good autofocusing and good resolution of the image sensor are needed.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
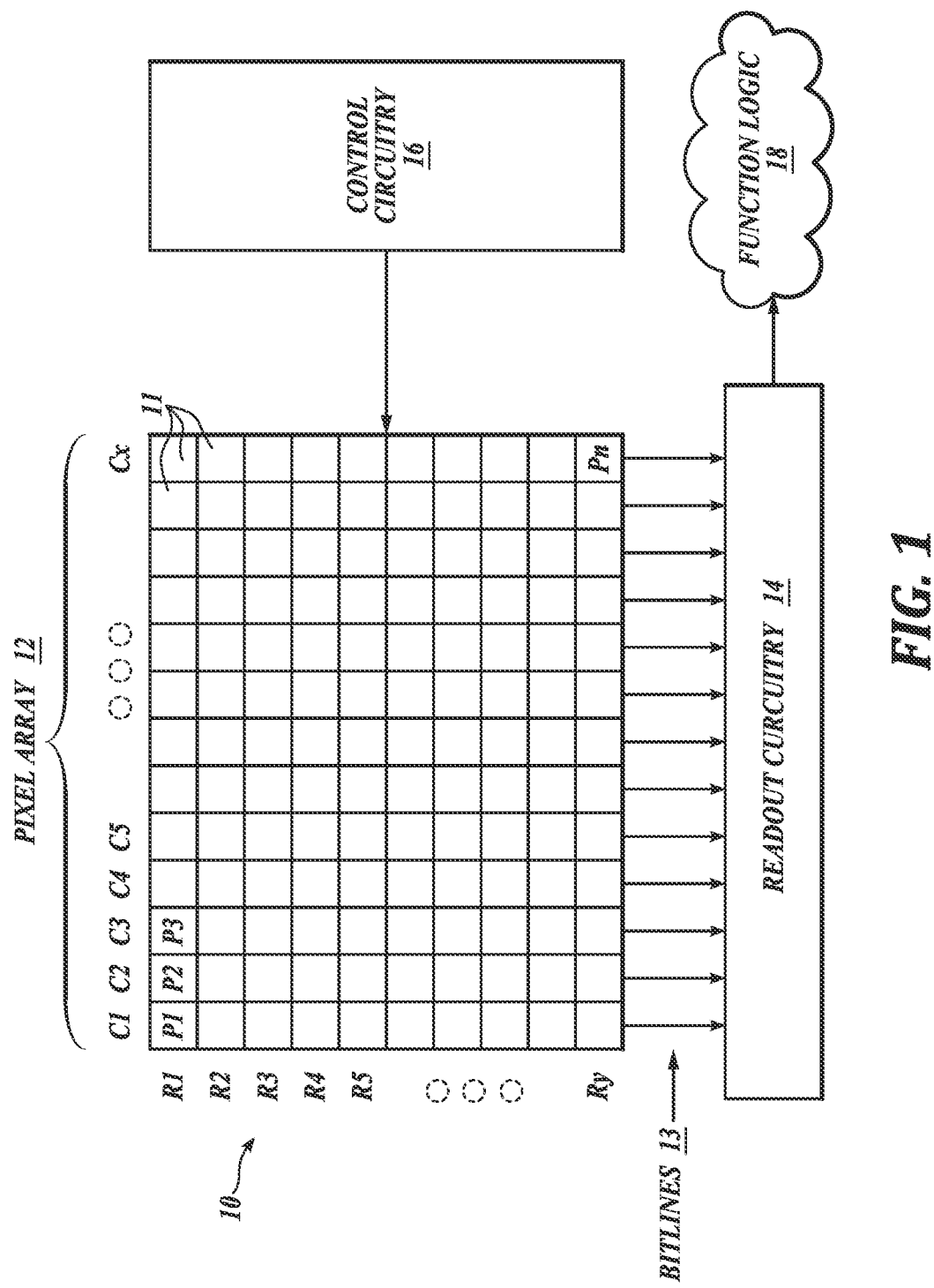
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors with microlenses that are arranged to improve resolution and autofocusing of the image sensor are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means +/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to image sensors having different sizes of microlenses that are used in conjunction with the pixels of different colors. In some embodiments, if the resolution of the image sensor is to be preserved or improved, then microlenses typically cover individual photodiodes (also referred to as subpixels) of a given pixel. For example, for a pixel having four photodiodes, four microlenses may be arranged over the individual photodiodes of a given pixel (e.g., blue pixel (B), green pixel (G), red pixel (R), or clear pixel (C)). On the other hand, if the autofocus function of the image senor is to be improved, then one large microlens typically covers all or several photodiodes (subpixels) of a given pixel, which, as described above, may take away from the resolution of the image sensor. Pixels that include four photodiodes are referred to as quad photodiode pixels or QPD pixels. Pixels that include two photodiodes are referred to as dual photo-diode pixels or DPD pixels.

In some embodiments of the present technology, micro-lenses having different sizes are used for pixels of the image sensor. For example, large and small microlenses may be distributed such that large microlenses cover several or all photodiodes of a given pixel, while small microlenses cover individual photodiodes of a given pixel. In some embodi-ments, large microlenses may be used to cover groups of red (R), green (G) and blue (B) photodiodes of their correspond-ing R, G and B pixels, while small microlenses cover individual clear (C) photodiodes of the C pixels. Since the C pixels tend to contribute more to the resolution of an image sensor, an acceptable resolution may be preserved, while the large lenses over the R, G and B pixels improve the autofocusing of such inventive image sensor.

In some embodiments, large microlenses may be used to cover groups of G photodiodes of the G pixels, while small microlenses cover individual R and B photodiodes of the R and G pixels, as well as individual C photodiodes of the C pixels. Since the C pixels tend to be more significant for the resolution of an image sensor, an acceptable resolution of the image sensor may be achieved, especially in view of the R and G pixels also using the small microlenses. Furthermore, since the G pixels contribute most to the autofocusing function of the image sensor, the autofocusing may also be preserved at an acceptable level with this embodiment of the inventive image sensor.

FIG. 1 is a diagram of an example image sensor 10 in accordance with an embodiment of the present technology. The image sensor 10 includes a pixel array 12, a control circuitry 16, a readout circuitry 14 and a function logic 18. In one example, the pixel array 12 is a two-dimensional (2D) array of image sensor pixels 11 (e.g., pixels P1, P2 . . . , Pn). Each image sensor pixel 11 includes multiple photodiodes (PDs) for light detection. As illustrated, the image sensor pixels 11 are arranged into rows (e.g., rows R1 to Ry) and columns (e.g., columns C1 to Cx). In operation, the image sensor pixels 11 acquire image data of a scene, which can then be used to render a 2D image of person, place, object, etc. However, in other embodiments the image sensor pixels 11 may be arranged into configurations other than rows and columns.

In an embodiment, after each image sensor pixel 11 in the pixel array 12 acquires its image charge, the image data is read out by the readout circuitry 14 via bitlines 13, and then transferred to a function logic 18. The readout image data of each image sensor pixel 11 collectively constitute an image frame. In various embodiments, the readout circuitry 14 may include signal amplifiers, analog-to-digital (ADC) conver-sion circuitry and data transmission circuitry. The function logic 18 may store the image data or even manipulate the image data by applying post image effects (e.g., crop, rotate, remove red eye, adjust brightness, adjust contrast, or other-wise). In some embodiments, the control circuitry 16 and function logic 18 may be combined into a single functional block to control the capture of images by the image sensor pixels 11 and the readout of image data from the readout circuitry 14. The function logic 18 may include a digital processor. In an embodiment, the readout circuitry 14 may read one row of image data at a time along readout column lines (bitlines 13) or may read the image data using a variety of other techniques, such as a serial readout or a full parallel readout of all pixels simultaneously. The above-described operation of the image sensor may be controlled by a controller or a computer through a computer-implemented method.

In an embodiment, the control circuitry 16 is coupled to the pixel array 12 to control operation of the plurality of photodiodes in the pixel array 12. For example, the control circuitry 16 may generate a shutter signal for controlling image acquisition. In an embodiment, the shutter signal is a global shutter signal for simultaneously enabling all pixels within the pixel array 12 to simultaneously capture their respective image data during a single data acquisition win-dow. In another embodiment, the shutter signal is a rolling shutter signal such that each row, column, or group of pixels is sequentially enabled during consecutive acquisition win-dows. In another embodiment, image acquisition is synchro-nized with lighting effects such as a flash. In different embodiments, the control circuitry 16 may be configured to control each of image sensor pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital repre-sentation. The digital representation of the image data may be provided to the function logic 18.

In different embodiments, image sensor 10 may be part of a digital camera, cell phone, laptop computer, or the like. In embodiments, image sensor 10 is incorporated as part of surveillance system or vision system for automobile. Addi-tionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Figure 2:
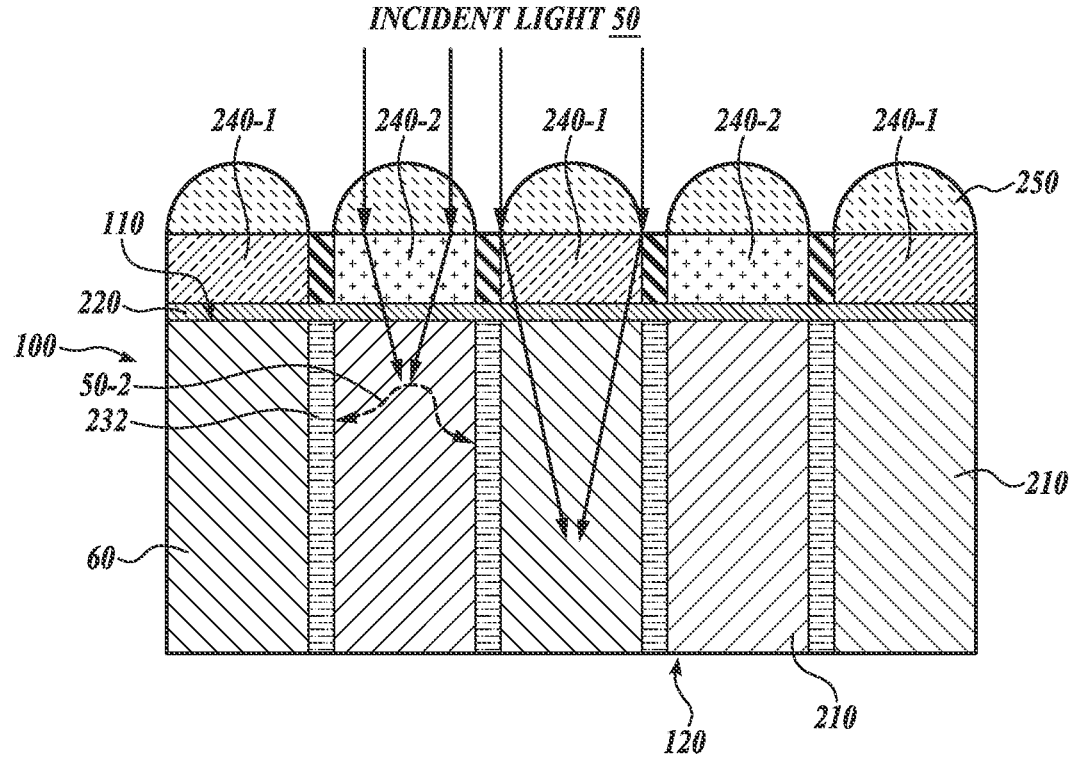
FIG. 2 is a cross-sectional side view of an example image sensor in accordance with embodiments of the present technology.

FIG. 2 is a cross-sectional side view of an example image sensor in accordance with embodiments of the present technology. In operation, incident light 50 (electromagnetic radiation) enters the image sensor 100 through microlenses 250 and color filters 240, which focus and appropriately color-filter the incident light for a given photodiode (PD) 210 inside a semiconductor material 60 (e.g., doped silicon). For example, a green photodiode 210 may be covered by a green color filter 240 that transmits green light, while reflecting other wavelengths of light. In some embodiments, a dielectric layer 220 (also referred to as a planarization layer or buffer oxide layer) separates the color filters 240 from the photodiodes 210. The color filters 240 may be configured to transmit green (G), red (R) or blue (B) light to their corresponding photodiodes, or to transmit all light (referred to as clear or C color filters and photodiodes). Photodiodes 210 operate to photogenerate electrical charge based on the incoming light 50. These electrical charges are subsequently selectively drained into the associated support-ing electronics of the photodiode 210, for example, a floating diffusion associated with the photodiode 210 through a respective coupled transfer transistor.

The photodiodes 210 may be prone to crosstalk. For example, the incoming light 50, for example light of longer wavelength such as red or infrared light may enter a PD 210 through a microlens 250 and a color filter 240-2, where the light is partially absorbed and partially transmitted in the direction of the neighboring PD 210, for example by refraction or reflection induced crosstalk. Such optical crosstalk occurs without the light passing through color filter 240-1 as designed for. Therefore, in some embodiments, the neighboring photodiodes 210 are separated by isolation structures 232 that limit propagation of stray light from one photodiode to another. Some examples of such isolation structures are deep trench isolation (DTI) structures 232 that vertically extend up to a depth (e.g., 1.5 um to 2.5 um) into the Silicon (Si) material from a backside 110 of the semiconductor material 60 (illuminated side of the image sensor). In different embodiments, the DTI structure 232 may include materials that are non-transparent to light, for example metals. In some embodiments, the DTI structure 232 may include dielectric material with refractive index lower than the semiconductor material such as silicon oxide. The DTI structure 232 may prevent or at least reduce the stray light from reaching the neighbor photodiodes. The illustrated DTI structures 232 extend essentially throughout the entire thickness of the Si material layer, but in different embodiments the DTI structures may extend only partially between the adjacent photodiodes. In one example, DTI structures 232 are interconnected thus forming a grid structure surrounding the PDs 210 and providing electrical and/or optical isolation between adjacent PDs.

Figure 3:
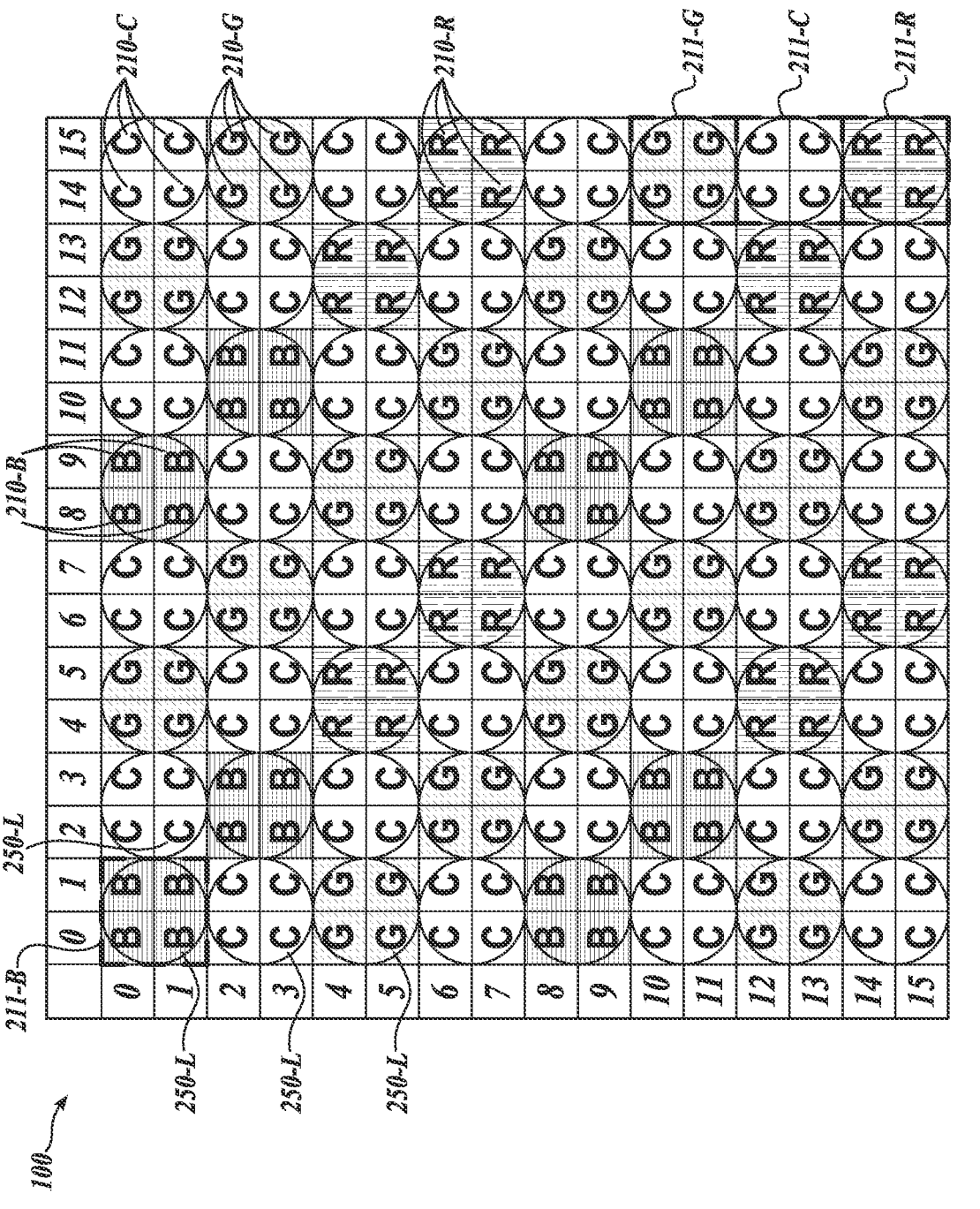
FIG. 3 is a top schematic view of an arrangement of microlenses over pixels in accordance with an embodiment of the present technology.

FIG. 3 is a top schematic view of an arrangement of microlenses over pixels in accordance with an embodiment of the present technology. The illustrated arrangement 100 includes 16×16 pixels, but other numbers of pixels are also possible in different embodiments. The illustrated arrangement may represent an entire image sensor or just a portion of the image sensor (e.g., just a section of a larger image sensor).

Exemplary illustrated arrangement includes B pixels 211-B, R pixels 211-R, G pixels 211-G and C pixels 211-C, each having four photodiodes 210 (e.g., blue photodiodes 210-B, red photodiodes 210-R, green photodiodes 210-G and clear photodiodes 210-C), that is, the illustrated pixels are QPD pixels. In different embodiments, other numbers of photodiodes per pixel are also possible, for example, two photodiodes per pixel, i.e., DPD pixels. In the illustrated embodiments, each pixel is covered by a large microlens 250-L. A person of ordinary skill will understand that the term "large microlens" signifies a microlens that covers multiple photodiodes of a given pixel. Such arrangement of microlenses over corresponding pixels generally results in good autofocusing properties of the image sensor, however, at a possible penalty in the resolution of the image sensor, depending on a particular usage scenario of the image sensor.

Figure 4:
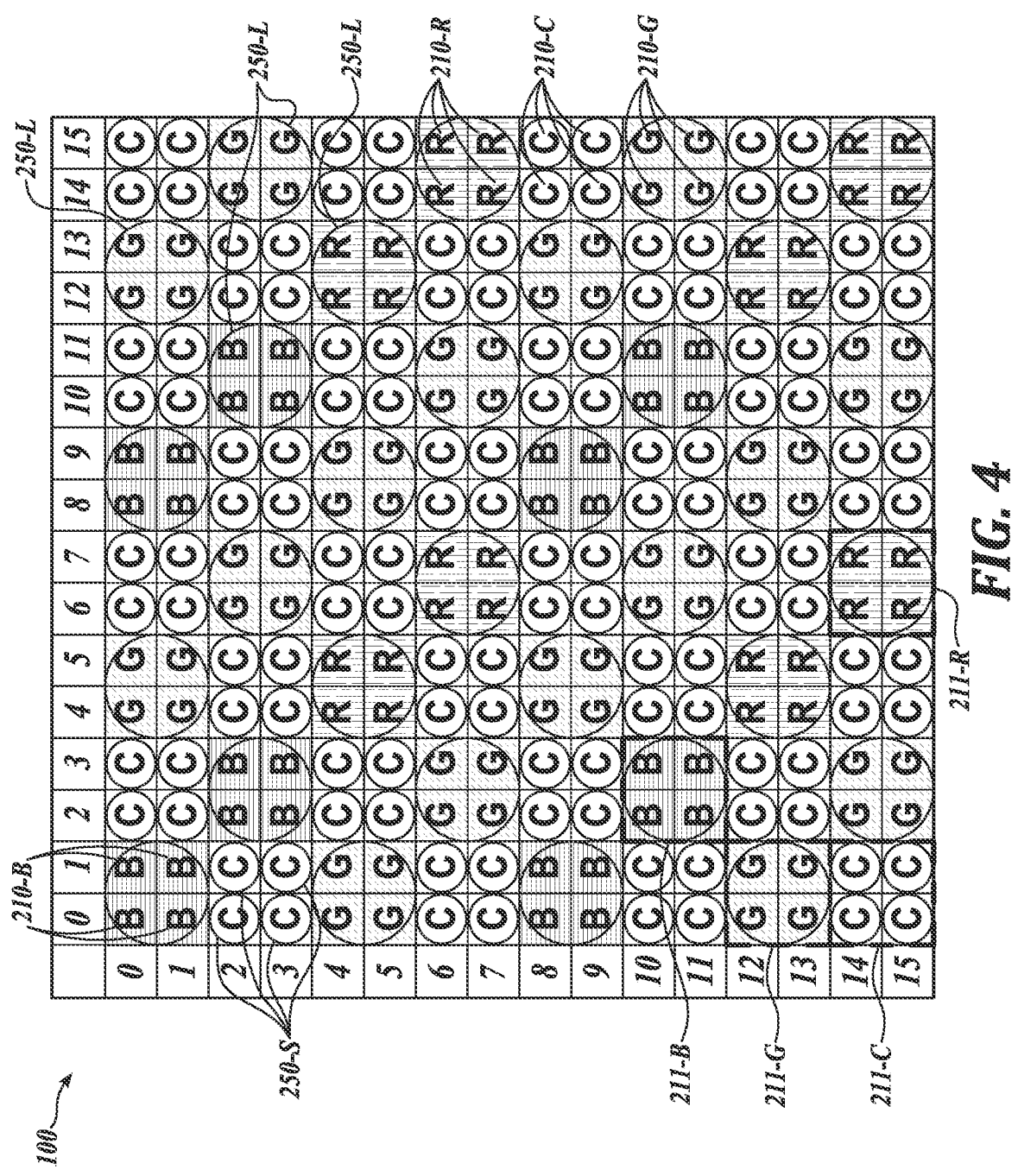
FIG. 4 is a top schematic view of an arrangement of microlenses over pixels in accordance with an embodiment of the present technology.

FIG. 4 is a top schematic view of an arrangement of microlenses over pixels in accordance with an embodiment of the present technology. The illustrated arrangement includes G, R and B pixels that have large microlenses 250-L, and C pixels that include several small microlenses 250-S. Generally, each small microlens 250-S covers one photodiode 211-C of the C pixel 210-C of the illustrated embodiment. Conversely, each large microlens 250-L covers all photodiodes 211-G, 211-R and 211-B of the corresponding pixels 210-G, 210-R and 210-B. The small microlenses 250-S and large microlenses 250-L may be characterized by their diameter, e.g., a diameter of the large microlenses 250-L being greater than a diameter of the small microlenses 250-S.

With the embodiment illustrated in FIG. 4, the resolution of the image sensor may be improved, because in many situation resolution properties of the image sensor depend more on the C pixels, than on the G, R or B pixels. On the other hand, the autofocusing properties may still be acceptable because G, R and B pixels include large lenses 250-L that promote autofocusing properties of the image sensor. As a result, the embodiment illustrated in FIG. 4, may represent an acceptable balance between the image sensor resolution and autofocusing.

Figure 5:
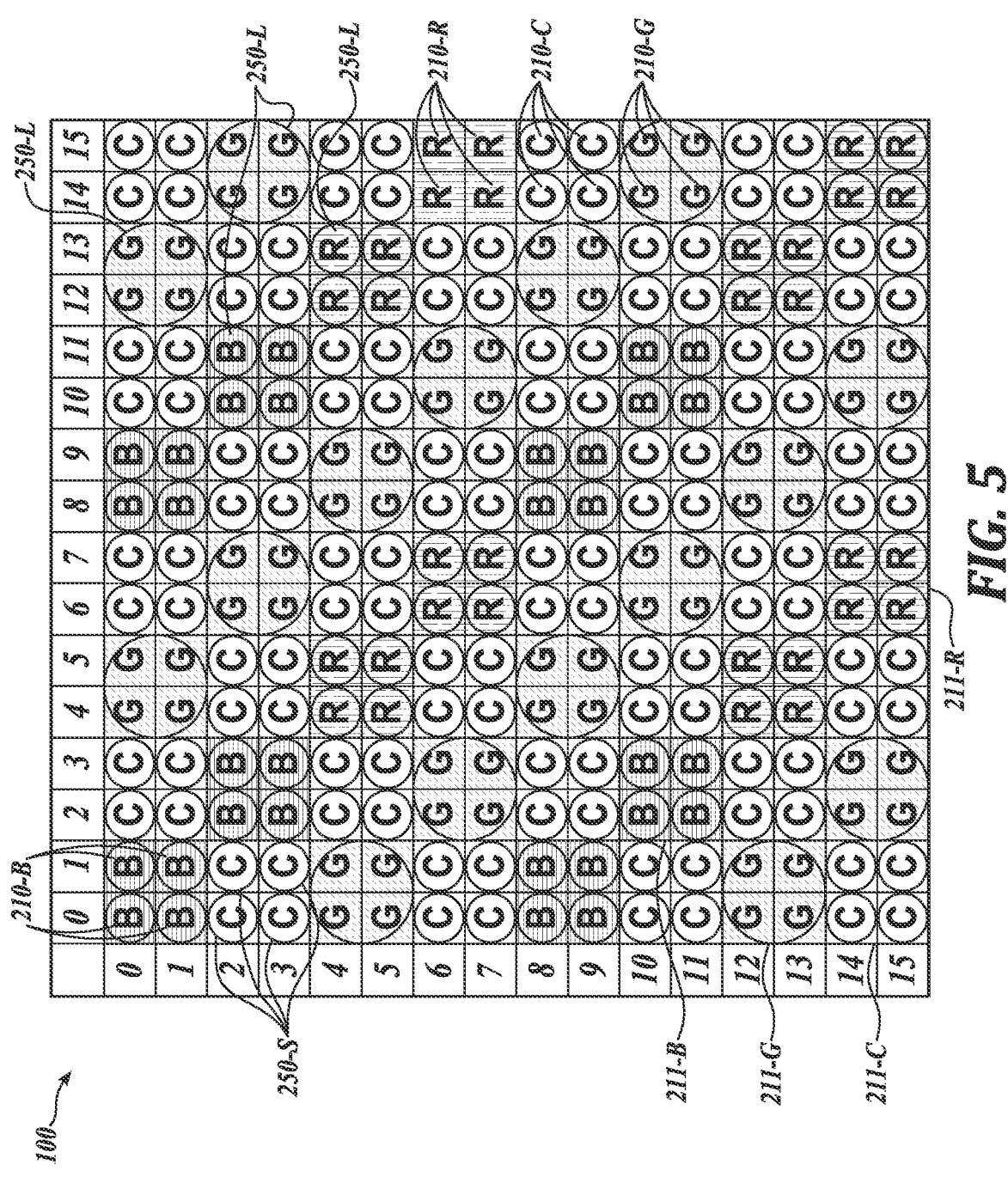
FIG. 5 is a top schematic view of an arrangement of microlenses over pixels in accordance with an embodiment of the present technology.

FIG. 5 is a top schematic view of an arrangement of microlenses over pixels in accordance with an embodiment of the present technology. The illustrated arrangement includes pixels G that have large microlenses 250-L covering all the photodiodes of corresponding G pixels, and pixels R, G and C each having several small microlenses 250-S (e.g., one microlens 250-S per photodiode). With the embodiment illustrated in FIG. 5, the resolution of the image sensor is generally good, because R, G and C pixels include small lenses 250-L that promote resolution of the image sensor. Furthermore, in many situations autofocusing properties of the image sensor depend strongly on the G pixels, which include large lenses 250-L that promote autofocusing properties. As a result, the embodiment illustrated in FIG. 5, may also represent a good balance between the image sensor resolution and autofocusing.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of pixels arranged in rows and columns of a pixel array disposed in a semiconductor material, wherein the plurality of pixels includes green (G) pixels, red (R) pixels, blue (B) pixels and clear (C) pixels, and wherein each green (G), red (R), blue (B), and clear (C) pixel comprises a plurality of photodiodes of the same color as the pixel, and wherein the photodiodes are configured to receive incoming light through an illuminated surface of the semiconductor material;

a green (G) color filter configured for transmitting green light to a green (G) photodiode;

a red (R) color filter configured for transmitting red (R) light to a red (R) photodiode;

a blue (B) color filter configured for transmitting blue (B) light to a blue (B) photodiode;

a clear (C) color filter configured for transmitting all light to a clear (C) photodiode;

a plurality of small microlenses each distributed over individual photodiodes of a given clear (C) pixel, wherein an incident light enters the image sensor through the small microlens and the clear (C) color filter; and a plurality of large microlenses each distributed over individual green (G) pixels such that each large microlens covers a plurality of photodiodes of the individual green (G) pixels;

wherein a diameter of the small microlenses is smaller than a diameter of the large microlenses.

2. The image sensor of claim 1, further comprising:

a plurality of large microlenses each distributed over individual red (R) pixels and individual blue (B) pixels such that each large microlens covers an entire plurality of photodiodes of a given individual red (R) or blue (B) pixel.

3. The image sensor of claim 1, further comprising:

a plurality of small microlenses each distributed over individual photodiodes of the red (R) pixels and the blue (B) pixels such that each red (R) and blue (B) pixel is covered by a plurality of small microlenses each distributed over individual photodiodes of a given red (R) and blue (B) pixel.

4. The image sensor of claim 1, wherein each pixel comprises four photodiodes.

5. The image sensor of claim 1, wherein the clear (C) pixels determine a resolution of the image sensor.

6. The image sensor of claim 1, wherein the green (G) pixels determine an autofocusing of the image sensor.

7. An image sensor, comprising:

a plurality of pixels arranged in rows and columns of a pixel array disposed in a semiconductor material, wherein the plurality of pixels includes green (G) pixels, red (R) pixels, blue (B) pixels and clear (C) pixels, and wherein each green (G), red (R), blue (B), and clear (C) pixel comprises a plurality of photodiodes of the same color as the pixel, and wherein the photodiodes are configured to receive incoming light through an illuminated surface of the semiconductor material;

a green (G) color filter configured for transmitting green light to a green (G) photodiode;

a red (R) color filter configured for transmitting red (R) light to a red (R) photodiode;

a blue (B) color filter configured for transmitting blue (B) light to a blue (B) photodiode;

a clear (C) color filter configured for transmitting all light to a clear (C) photodiode;

a plurality of small microlenses each distributed over individual photodiodes of a given clear (C) pixel, wherein an incident light enters the image sensor through the small microlens and the clear (C) color filter; and a plurality of large microlenses each distributed over individual green (G) pixels, red (R) pixels, and blue (B)

pixels such that each large microlens covers a plurality of photodiodes of the individual green (G), red (R), and blue (B), pixels, wherein a diameter of the small microlenses is smaller than a diameter of the large microlenses.

8. The image sensor of claim 7, wherein each pixel comprises four photodiodes.

9. The image sensor of claim 7, wherein the clear (C) pixels determine a resolution of the image sensor.

10. The image sensor of claim 7, wherein the green (G) pixels determine an autofocusing of the image sensor.

11. A computer-implemented method for operating an image sensor, the method comprising:

exposing at least a portion of an image sensor to incident electromagnetic radiation, the image sensor comprising:

a plurality of pixels arranged in rows and columns of a pixel array disposed in a semiconductor material, wherein the plurality of pixels includes green (G) pixels, red (R) pixels, blue (B) pixels and clear (C) pixels, and wherein each green (G), red (R), blue (B), and clear (C) pixel comprises a plurality of photodiodes of the same color as the pixel, and wherein the photodiodes are configured to receive incoming light through an illuminated surface of the semiconductor material, a green (G) color filter configured for transmitting green light to a green (G) photodiode;

a red (R) color filter configured for transmitting red (R) light to a red (R) photodiode, a blue (B) color filter configured for transmitting blue (B) light to a blue (B) photodiode, a clear (C) color filter configured for transmitting all light to a clear (C) photodiode, a plurality of small microlenses each distributed over individual photodiodes of a given clear (C) pixel, wherein an incident light enters the image sensor through the small microlens and the clear (C) color filter; and a plurality of large microlenses each distributed over individual green (G) pixels such that each large microlens covers a plurality of photodiodes of the individual green (G) pixels;

wherein a diameter of the small microlenses is smaller than a diameter of the large microlenses.

12. The computer-implemented method of claim 11, wherein the image sensor further comprises:

a plurality of large microlenses each distributed over individual red (R) pixels and individual blue (B) pixels such that each large microlens covers an entire plurality of photodiodes of a given individual red (R) or blue (B) pixel.

13. The computer-implemented method of claim 11, wherein the image sensor further comprises:

a plurality of small microlenses each distributed over individual photodiodes of the red (R) pixels and the blue (B) pixels such that each red (R) and blue (B) pixel is covered by a plurality of small microlenses each distributed over individual photodiodes of a given red (R) and blue (B) pixel.

14. The computer-implemented method of claim 11, wherein each pixel comprises four photodiodes.

15. The computer-implemented method of claim 11, wherein the clear (C) pixels determine a resolution of the image sensor.

16. The computer-implemented method of claim 11, wherein the green (G) pixels determine an autofocusing of the image sensor.

* * * * *